(12) United States Patent
Hull et al.

(10) Patent No.: US 7,638,186 B2
(45) Date of Patent: Dec. 29, 2009

(54) FLUOROPOLYMER CONTAINING LAMINATES

(75) Inventors: Dennis Hull, Vadnais Heights, MN (US); Joseph G. Walton, Uno Lakes, MN (US); Maria P. Dillon, Minneapolis, MN (US); David B. Redmond, Saint Paul, MN (US); Mark W. Muggli, West Saint Paul, MN (US); Thomas J. Blong, Woodbury, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 224 days.

(21) Appl. No.: 11/423,784

(22) Filed: Jun. 13, 2006

(65) Prior Publication Data

US 2006/0280922 A1   Dec. 14, 2006

Related U.S. Application Data

(60) Provisional application No. 60/689,840, filed on Jun. 13, 2005.

(51) Int. Cl.
*B32B 27/32* (2006.01)
*B32B 27/00* (2006.01)
*B32B 27/36* (2006.01)

(52) U.S. Cl. .................. 428/220; 428/332; 428/421; 428/422; 428/480; 428/483; 428/500

(58) Field of Classification Search ................ None
See application file for complete search history.

(56) References Cited

U.S. PATENT DOCUMENTS

| | | | |
|---|---|---|---|
| 6,441,299 B2 * | 8/2002 | Otani et al. .................. 136/251 |
| 6,630,047 B2 | 10/2003 | Jing et al. |
| 6,753,087 B2 | 6/2004 | Jing et al. |
| 6,767,948 B1 | 7/2004 | Jing |
| 2004/0151914 A1 * | 8/2004 | Kaya et al. ................... 428/421 |
| 2004/0202866 A1 * | 10/2004 | Kernander et al. ........... 428/421 |
| 2004/0261836 A1 * | 12/2004 | Kataoka et al. .............. 136/244 |
| 2004/0265539 A1 | 12/2004 | Hashimoto et al. |
| 2005/0080210 A1 | 4/2005 | Jing et al. |

FOREIGN PATENT DOCUMENTS

EP   1182710   2/2002

\* cited by examiner

*Primary Examiner*—Sheeba Ahmed
(74) *Attorney, Agent, or Firm*—Julie A. Lapos-Kuchar; Brian E. Szymanski

(57) ABSTRACT

The multilayer film serves as a laminate. The film is a multi-layered structure that, in its base form, encompasses an intermediate layer with first and second outer layer affixed to opposing sides of the intermediate layer. The first outer layer is a semi-crystalline fluoropolymer. The intermediate layer includes a polyester and the second outer layer is an olefinic polymer. The layers are bonded together in the noted order to provide the multilayer film.

12 Claims, No Drawings

FLUOROPOLYMER CONTAINING LAMINATES

CROSS-REFERENCE TO RELATED APPLICATION

This application claims priority to U.S. Provisional Patent Application No. 60/689,840, filed Jun. 13, 2005, herein incorporated by reference in its entirety.

TECHNICAL FIELD

This invention relates to multilayer fluoropolymer films or laminates, and methods for their manufacture that are useful as a backing film for solar cells.

BACKGROUND

Multilayer films or laminates are constructions, which attempt to marry the properties of dissimilar materials in order to provide an improved performance. Such properties include barrier resistance to elements such as water, cut-through resistance, weathering resistance and electrical insulation. Previous laminates have addressed many of the needs for solar modules, but often result in a mis-balance of properties, are more expensive, or difficult to handle or process. In addition, the inner layers are often not fully protected over the life of the module.

In order to improve the durability, longevity and performance of photovoltaic modules, backside laminates are being developed with thicker layers of barrier materials such as PET, (polyethylene terepthalate), or resort to the use of metal foils, inorganic coatings, or multiple layers of fluoropolymers. These endeavors typical result in constructions, which are often more expensive, and/or laminates which are stiffer (i.e. of higher modulus), and that are more difficult to apply to the backside of solar modules. Additionally, the conventional constructions typically require that the completed, typically multilayer, construction be subjected to a heating cycle prior to lamination so that the entire construction can be successfully laminated.

SUMMARY

Briefly, the present invention is directed to a multilayer film. The multilayer film includes a polyester intermediate layer having first and second outer layers bonded to opposing sides of the intermediate layer. The first outer layer is a semi-crystalline fluoropolymer with a tensile modulus of less than 100,000 psi. The intermediate layer has a shrinkage rate of less than 1% at 150° C. when held for about 15 minutes and a second outer layer is an olefinic polymer.

The invention also provides a process for preparing a layered article comprising providing a first intermediate layer of a polyester having a first and second surface, wherein the first layer has a shrinkage of less than about 1% at 150° C. when held for about 15 minutes; applying a first outer layer of semi-crystalline fluoropolymer, with a tensile modulus of less than 100,000 psi, to the first surface; applying a second outer layer of an olefinic polymer to the second surface; and bonding the layers to form the multilayer film through the application of energy, mechanical forces or both.

Other features and advantages of the invention will be apparent from the following detailed description of the invention and the claims. The above summary of principles of the disclosure is not intended to describe each illustrated embodiment or every implementation of the present disclosure. The following details more particularly exemplify certain preferred embodiments utilizing the principles disclosed herein.

DETAILED DESCRIPTION

The present invention is a multilayer film that serves as a laminate. In a preferred embodiment, the multilayer film provides durability, longevity and performance enhancements of photovoltaic modules when it is utilized as a backside film on the modules. The film is a multilayered structure that, in its base form, encompasses an intermediate layer with first and second outer layer affixed to opposing sides of the intermediate layer. The first outer layer is a semi-crystalline fluoropolymer with a tensile modulus of less than 100,000 psi, as defined in ASTM D638. The intermediate layer includes a polyester having a shrinkage rate of less than 1% measured at 150° C. when held for about 15 minutes. The second outer layer is an olefinic polymer. The layers are bonded together in the noted order to provide the multilayer film.

In it's various aspects, the fluoropolymer component of the first outer layer can be selected from a variety of fluoropolymers. Such fluoropolymers are typically copolymers of TFE or VDF with other fluorinated or non-fluorinated monomers. Representative materials include copolymers of tetrafluoroethylene-ethylene (ETFE), tetrafluoroethylene-hexafluoropropylene (FEP), tetrafluoroethylene-perfluoroalkoxyvinlyether (PFA), copolymers of vinylidene fluoride and chlorotrifluoroethylene, tetrafluoroethylene-hexafluoropropylene-ethylene (HTE), copolymers of vinylidene fluoride and chlorotrifluoroethylene, or a copolymer derived from tetrafluoroethylene (TFE), hexafluoropropylene (HFP), and vinylidene fluoride (VDF), such as the THV series available from Dyneon LLC, Oakdale, Minn.

The first outer layer possesses a tensile modulus of less than 100,000 psi. The noted tensile modulus is directed to achieving desired flexural characteristics in order to make the finished film structure pliable in its intended application. Additionally, the fluoropolymer outer layer is preferably capable of providing low permeability characteristics to the construction in order to protect internal components of the file or of the preferred solar cell application.

A preferred class of fluorinated copolymers suitable as the first outer layer are those having interpolymerized units derived from tetrafluoroethylene, hexafluoropropylene, and vinylidene fluoride, and optionally a perfluoro alkyl or alkoxy vinyl ether. Preferably these polymers have less than about 30 weight percent (wt %) VDF, more preferably between about 10 and about 25 wt %, of its interpolymerized units derived from VDF. A non-limiting example includes THV 500 available from Dyneon LLC, Oakdale, Minn.

Another preferred class of materials suitable for use as the first outer layer include various combinations of interpolymerized units of TFE and ethylene along with other additional monomers such as HFP, perfluoro alkyl or alkoxy vinyl ethers (PAVE or PAOVE). An example being HTE 1510, available from Dyneon LLC, Oakdale, Minn.

The present invention contemplates that any polyester polymer capable of being processed into film form may be suitable as an intermediate layer. These may include, but are not limited to, homopolymers and copolymers from the following families: polyesters, such as polyethylene terephthalate (PET), and liquid crystalline polyesters.

In alternative embodiment, the intermediate may include other polymers such, for example: polyarylates; polyamides, such as polyamide 6, polyamide 11, polyamide 12, polyamide 46, polyamide 66, polyamide 69, polyamide 610, and polyamide 612; aromatic polyamides and polyphthalamides; thermoplastic polyimides; polyetherimides; polycarbonates, such as the polycarbonate of bisphenol A; acrylic and methacrylic polymers such as polymethyl methacrylate; chlorinated polymers, such as polyvinyl chloride and polyvinylidene chloride; polyketones, such as poly(aryl ether ether ketone) (PEEK) and the alternating copolymers of ethylene or propylene with carbon monoxide; polystyrenes of any tacticity, and ring- or chain-substituted polystyrenes; polyethers, such as polyphenylene oxide, poly(dimethylphenylene oxide), polyethylene oxide and polyoxymethylene; cellulosics, such as the cellulose acetates; and sulfur-containing polymers such as polyphenylene sulfide, polysulfones, and polyethersulfones.

A most preferred material is polyethyleneterepthalate, (PET).

In one aspect of the invention, the intermediate layer is pre-shrunk prior to formation of the multilayer film. The shrinking of the polyester intermediate layer results in an intermediate layer that will shrink less than 1% of it's total length in either planer direction when exposed to a temperature of 150° C. during a period of 15 minutes, in accordance with ASTM D 2305-02. Such films are commercially available or can be prepared by exposing the film, under minimal tension, to a temperature above it's glass transition temperature, preferable above 150° C. for a period of time sufficient to pre-shrink the film. Such thermal treatment can occur either as a post treatment or during the initial manufacturing process used to produce the film.

Olefinic polymers useful in the composition of the invention as an outer layer include polymers and copolymers derived from one or more olefinic monomers of the general formula $CH_2=CHR"$, wherein R" is hydrogen or $C_{1-18}$ alkyl. Examples of such olefinic monomers include propylene, ethylene, and 1-butene, with ethylene being generally preferred. Representative examples of polyolefins derived from such olefinic monomers include polyethylene, polypropylene, polybutene-1, poly(3-methylbutene), poly(4-methylpentene) and copolymers of ethylene with propylene, 1-butene, 1-hexene, 1-octene, 1-decene, 4-methyl-1-pentene, and 1-octadecene.

The olefinic polymers may optionally comprise a copolymer derived from an olefinic monomer and one or more further comonomers that are copolymerizable with the olefinic monomer. These comonomers can be present in the polyolefin in an amount in the range from about 1 to 10 wt-% based on the total weight of the polyolefin. Useful such comonomers include, for example, vinyl ester monomers such as vinyl acetate, vinyl propionate, vinyl butyrate, vinyl chloroacetate, vinyl chloropropionate; acrylic and alpha-alkyl acrylic acid monomers, and their alkyl esters, amides, and nitriles such as acrylic acid, methacrylic acid, ethacrylic acid, methyl acrylate, ethyl acrylate, N,N-dimethyl acrylamide, methacrylamide, acrylonitrile; vinyl aryl monomers such as styrene, o-methoxystyrene, p-methoxystyrene, and vinyl naphthalene; vinyl and vinylidene halide monomers such as vinyl chloride, vinylidene chloride, and vinylidene bromide; alkyl ester monomers of maleic and fumaric acid such as dimethyl maleate, and diethyl maleate; vinyl alkyl ether monomers such as vinyl methyl ether, vinyl ethyl ether, vinyl isobutyl ether, and 2-chloroethyl vinyl ether; vinyl pyridine monomers; N-vinyl carbazole monomers, and N-vinyl pyrrolidine monomers.

The olefinic polymers may also contain a metallic salt form of a polyolefin, or a blend thereof, which contains free carboxylic acid groups. Illustrative of the metals which can be used to provide the salts of said carboxylic acid polymers are the one, two and three valence metals such as sodium, lithium, potassium, calcium, magnesium, aluminum, barium, zinc, zirconium, beryllium, iron, nickel and cobalt.

The olefinic polymers may also include blends of these polyolefins with other polyolefins, or multi-layered structures of two or more of the same or different polyolefins. In addition, they may contain conventional adjuvants such as antioxidants, light stabilizers, acid neutralizers, fillers, antiblocking agents, pigments, primers and other adhesion promoting agents.

Preferred olefinic polymers include homopolymers and copolymers of ethylene with alpha-olefins as well as copolymers of ethylene and vinyl acetate. Representative materials of the latter include Elvax 150, 3170, 650 and 750 available from E.I. du Pont de Nemours and Company.

Optionally, one or more layers in a multilayer article of the invention may also include known adjuvants such as antioxidants, light stabilizers, conductive materials, carbon black, graphite, fillers, lubricants, pigments, plasticizers, processing aids, stabilizers, and the like including combinations of such materials. In addition, metallized coatings and reinforcing materials also may be used in the invention. These include, e.g., polymeric or fiberglass scrim that can be bonded, woven or non-woven. Such a material optionally may be used as a separate layer or included within a layer in a multi-layer embodiment of the present invention.

To be most useful, the multilayer articles of the present invention should not delaminate during use. That is, the adhesive bond strength between the different layers of the multilayer article should be sufficiently strong and stable so as to prevent the different layers from separating on exposure to, for example, moisture, heat, cold, wind, chemicals and or other environmental exposure. The adhesion may be required between non-fluoropolymer layers or adjacent the fluoropolymer layer. Various methods of increasing interlayer adhesion in all cases are generally known by those of skill in the art. The article of the invention may also include a bonding interface or agent between said outer and intermediate layers.

A variety of methods have been employed to bond polymeric materials comprising a fluoropolymer to substantially non-fluorinated polymeric materials. For example, the layers can be adhesively bonded together by a layer of adhesive material between the two layers. Alternatively, surface treatment of one or both of the layers, used independently or in conjunction with adhesive materials, has been used to bond the two types of materials together. For example, layers comprising a fluoropolymer have been treated with a charged gaseous atmosphere followed by lamination with a layer of a non-fluorinated polymer. As another approach, "tie-layers" have been used to bond a fluoropolymer material to a layer of material comprising a substantially non-fluorinated polymer.

One specific surface treatment of a fluoropolymer for improving adhesion is disclosed in U.S. Pat. No. 6,630,047, herein incorporated by reference in its entirety. The specific surface treatment involves the use of actinic radiation, such as ultraviolet radiation in combination with a light-absorbing compound and an electron donor.

In a preferred embodiment, one such tie layer method for improving interlayer adhesion with the fluoropolymer comprises blending a base and an aromatic material such as a catechol novolak resin, a catechol cresol novolak resin, a polyhydroxy aromatic resin (optionally with a phase transfer catalyst) with the fluoropolymer and then applying to either layer prior to bonding. Alternatively, this composition may be used as the fluoropolymer layer without separate tie layer as disclosed in U.S. Published Application No. 2005/0080210 A1, herein incorporated by reference in its entirety.

Another tie layer method for bonding fluoropolymers is the use of a combination of a base, a crown ether and a non-fluoropolymer. This method is disclosed in U.S. Pat. No. 6,767,948, herein incorporated by reference in its entirety.

Another method that may be used as a tie layer or as a primer for bonding fluoropolymers involves the use of an amino substituted organosilane. The method is fully disclosed in U.S. Pat. No. 6,753,087, herein incorporated by reference in its entirety. The organosilane may optionally be blended with a functionalized polymer.

Adhesion between non-fluoropolymer layers may also be accomplished in a variety of ways including the application of anhydride or acid modified polyolefins, the application of silane primers, utilization of electron beam radiation, utilization of ultraviolet light and heat, or combinations thereof.

In a preferred embodiment, the intermediate layer and the second outer layer may be combined such as those commercially available as 3M™ Scotchpak™ Heat Sealable Polyester Films which include PET films combined with olefinic polymers such as polyester and ethylene vinyl acetate.

Those of ordinary skill in the art are capable of matching the appropriate the conventional bonding techniques to the selected multilayer materials to achieve the desired level of interlayer adhesion.

The multi-layer articles of the invention can be prepared by several different methods. For instance, one process for preparing a multilayer article featuring a fluoropolymer layer of the present invention involves extruding one layer through a die to form a length of film. A second extruder supplies a die to coat another layer of molten polymer onto a surface of the first film. Additional layers can be added through similar means. Alternatively, the polymeric resins of two or more substituent layers may be co-extruded through a multi-manifold die to yield an intermediate or final product.

Those skilled in the art of coating technology are capable of selecting process equipment and processing conditions to address selected materials and thereby produce the desired multilayer film.

Following the extrusion operations, the multi-layer article may be cooled, e.g., by immersion in a cooling bath. This process can be used to form multilayer sheets of the invention. In addition, the layers are preferably pressed together, such as through a nip or platen or other known means. Generally, increasing the time, temperature, and/or pressure can improve interlayer adhesion. The conditions for bonding any two layers can be optimized through routine experimentation.

Yet another useful method is to pre-form the individual film layers and then contact them in a process such as thermal lamination in order to form a finished article of the invention.

The inter-layer adhesion promoting agents, if required, can be applied either sequentially, simultaneously or in-situ with any of the before described processes.

The intermediate layer, prior to application of the outer layers, should have a shrinkage rate of less than 1% at 150° C. when held for about 15 minutes, as previously indicated. In that regard, it may be necessary to pre-shrink the intermediate layer before the application of the other outer layers. Even then so, care must be taken with the addition of the outer layers such that inner layer is not overly tensioned or strained which can reintroduce shrinkage into the overall construction. Pre-shrinking of the film after the addition of other layers can become exceedingly difficult especially if one or more of the additional outer layers has a softening or melting point that is within the temperature range required to pre-shrink the intermediate layer.

The thickness of the individual layers within the multilayer film can be varied and tailored per the end-use application requirements. In general though, the outer layer of fluoropolymer will be from about 0.5 mils to 5 mils, preferably 1 to 2 mils thick; the intermediate layer will be from about 1 to 10 mils, preferable 2 to 4 mils; and the outer polyolefin layer will be from 1 to 20 mils or greater, preferable it is 10 mils or greater. The thickness of the overall construction is typically 15 mils or greater, and in a preferred embodiment, the thickness of the outer polyolefin layer is as thick, preferably twice as thick, or greater than the combined thickness of the intermediate and fluoropolymer layers.

The multilayer film of the present invention is suitable for various end use applications. For example, the film may be utilized as a backing layer on solar cells structures. The use of the multilayer film in this manner results in a low cost, conformable, readily applied backing.

Various modifications and alterations of this invention will become apparent to those skilled in the art without departing from the scope and principles of this invention, and it should be understood that this invention is not to be unduly limited to the illustrative embodiments set forth hereinabove. All publications and patents are herein incorporated by reference to the same extent as if each individual publication or patent was specifically and individually indicated to be incorporated by reference.

We claim:

1. A multilayer film comprising:
   a first outer layer of a semi-crystalline fluoropolymer with a tensile modulus of less than 100,000 psi;
   an intermediate layer of polyethylene terephthalate having at least two planar directions and a shrinkage of less than 1% in each planar direction when held for 15 minutes at 150° C. measured in accordance with ASTM 2305-02; and
   a second outer layer of an olefinic polymer of the formula $CH_2=CHR''$, wherein R'' is hydrogen or a $C_{1-18}$ alkyl, and wherein the first outer layer and the second outer layer are bonded to opposing sides of the intermediate layer.

2. A multilayer film of claim 1 wherein the first outer layer comprises interpolymerized units of tetrafluoroethylene, hexafluoropropylene and vinylidene fluoride.

3. A multilayer film of claim 1 wherein the first outer layer comprises interpolymerized units of tetrafluoroethylene and ethylene.

4. The multilayer film of claim 1 further comprising applying a tie layer between the first outer layer and the intermediate layer, the second outer layer and intermediate layer, or both.

5. A multilayer film of claim 1 wherein the second outer layer comprises interpolymerized units of ethylene vinyl actetate.

6. A multilayer film of claim 1 wherein the thickness of the second outer layer is greater than or about twice the combined thickness of the first outer layer and the intermediate layer.

7. A multilayer film of claim 1 wherein the thickness of the multilayer film is greater than 15 mils.

8. A multilayer film of claim 1 wherein the fluoropolymer has a tensile modulus of less than 80,000 psi.

9. A multilayer film of claim 1 wherein the shrinkage of the multilayer film is less than 1% at 150° C. when held for 15 minutes measured in accordance with ASTM 2305-02.

10. An article comprising the multilayer film of claim 1 applied to a substrate.

11. The article of claim 10, wherein the substrate is a solar cell.

12. The article of claim 11, wherein the substrate is a backing layer on the solar cell.

* * * * *

UNITED STATES PATENT AND TRADEMARK OFFICE
CERTIFICATE OF CORRECTION

PATENT NO.        : 7,638,186 B2                                    Page 1 of 1
APPLICATION NO.   : 11/423784
DATED             : December 29, 2009
INVENTOR(S)       : Dennis E Hull It is certified that error appears in the above-identified patent and that said Letters Patent is hereby corrected as shown below:

On the Title Page, Item (75) (Inventors)
Line 2, delete "Uno Lakes" and insert in place thereof -- Lino Lakes --.

Column 1
Line 31, delete "(polyethylene terepthalate)," and insert in place thereof
-- (polyethylene terephthalate) --.

Column 2
Line 22-23, delete "tetrafluoroethylene-perfluoroalkoxyvinlyether" and
insert in place thereof -- tetrafluoroethylene-perfluoroalkoxyvinylether --.

Line 59 (approx.), delete "polyarylates;" and insert in place thereof
-- polyacrylates; --.

Column 3
Line 8, delete "polyethyleneterepthalate," and insert in place thereof
-- polyethylene terephthalate, --.

Column 4
Line 49, delete first instance of "novolak" and insert in place thereof
-- novolac --.

Line 49, delete second instance of "novolak" and insert in place thereof
-- novolac --.

Column 6
Line 42, in Claim 5, delete "actetate" and insert in place thereof -- acetate --.

Signed and Sealed this

Twenty-seventh Day of April, 2010

David J. Kappos
*Director of the United States Patent and Trademark Office*